(12) United States Patent
Dosanjh et al.

(10) Patent No.: US 8,847,357 B2
(45) Date of Patent: Sep. 30, 2014

(54) OPTO-ELECTRONIC DEVICE

(75) Inventors: Sukhjiban Dosanjh, Ipswich (GB); Ian Lealman, Ipswich (GB); Gordon Burns, Ipswich (GB); Michael Robertson, Ipswich (GB)

(73) Assignee: The Centre for Intergrated Photonics Limited, Ipswich (GB)

( * ) Notice: Subject to any disclaimer, the term of this patent is extended or adjusted under 35 U.S.C. 154(b) by 0 days.

(21) Appl. No.: 13/571,067

(22) Filed: Aug. 9, 2012

(65) Prior Publication Data
US 2013/0200492 A1  Aug. 8, 2013

Related U.S. Application Data

(63) Continuation of application No. PCT/GB2011/050221, filed on Feb. 9, 2011.

(30) Foreign Application Priority Data

Feb. 9, 2010 (GB) .................................. 1002088.1

(51) Int. Cl.
| | |
|---|---|
| *H01L 21/70* | (2006.01) |
| *B82Y 20/00* | (2011.01) |
| *H01S 5/227* | (2006.01) |
| *H01L 29/06* | (2006.01) |
| *H01S 5/22* | (2006.01) |
| *H01L 33/14* | (2010.01) |
| *H01S 5/343* | (2006.01) |

(52) U.S. Cl.
CPC ........... *H01L 29/0607* (2013.01); *H01S 5/2224* (2013.01); *H01S 5/2226* (2013.01); *H01S 5/2206* (2013.01); *H01L 33/145* (2013.01); *B82Y 20/00* (2013.01); *H01S 5/34313* (2013.01); *H01S 5/3434* (2013.01); *H01S 5/2227* (2013.01); *H01S 5/2275* (2013.01); *H01S 5/34306* (2013.01)
USPC .......................................... 257/547; 438/686

(58) Field of Classification Search
CPC ..................................................... H01L 33/145
USPC .......................................................... 257/547
See application file for complete search history.

(56) References Cited

U.S. PATENT DOCUMENTS 5,936,990 A    8/1999  Nakamura
6,664,605 B1 * 12/2003  Akulova et al. ............... 257/432
(Continued)

FOREIGN PATENT DOCUMENTS

| CN | 1487334 A | 4/2004 |
|---|---|---|
| EP | 0814549 A2 | 12/1997 |

(Continued)

OTHER PUBLICATIONS

Lealman et al, "Reliable 1550nm SI BH Lasers Fabricated Using An Improved Ru Precursor", IEEE, May 25-29, 2008 pp. 1-4.*

(Continued)

*Primary Examiner* — Nicholas Tobergte
(74) *Attorney, Agent, or Firm* — Brinks Gilson & Lione

(57) ABSTRACT

The present invention provides a current blocking structure for electronic devices, preferably optoelectronic devices. The current blocking structure comprises a semiconductor material arrangement comprising an n-type ruthenium doped indium phosphide (Ru—InP) layer and a first p-type semiconductor material layer wherein the n-type Ru—InP layer is less than 0.6 μm thick. The semiconductor material arrangement and p-type semiconductor material layer form a current blocking p-n junction. The current blocking structure may further comprise other n-type layers and/or multiple n-type Ru—InP layers and/or intrinsic/undoped layers wherein the n-type Ru—InP layers may be thicker than 0.6 μm.

14 Claims, 10 Drawing Sheets

(56) References Cited

U.S. PATENT DOCUMENTS

| | | | |
|---|---|---|---|
| 6,717,187 B2* | 4/2004 | Kondo et al. | 257/183 |
| 6,911,713 B2* | 6/2005 | Ikeda et al. | 257/466 |
| 7,075,119 B2* | 7/2006 | Hanamaki | 257/102 |
| 8,068,526 B2* | 11/2011 | Makino et al. | 372/43.01 |
| 2003/0209771 A1* | 11/2003 | Akulova et al. | 257/432 |
| 2004/0048406 A1 | 3/2004 | Ikeda et al. | |
| 2004/0213313 A1* | 10/2004 | Akulova et al. | 372/46 |
| 2008/0049805 A1 | 2/2008 | Takiguchi et al. | |

FOREIGN PATENT DOCUMENTS

| | | |
|---|---|---|
| JP | 10-12961 A | 1/1998 |
| JP | 2007194363 A | 8/2007 |

OTHER PUBLICATIONS

Matsuyuki Ogasawara et al, Correlation between Fe-Zn Interdiffusion . . . , Apr. 2003, Jpn. J. Appl. Phys. vol. 42 (2003) pp. 2320-2324.*

Office Action issued in corresponding European Patent Application No. 11730725.6, mailed May 15, 2013.

International Search Report and Written Opinion of the International Searching Authority issued in corresponding PCT Patent Application No. PCT/GB2011/050221, mailed Oct. 27, 2011.

Lealman et al., "Reliable 1550nm SI BH Lasers Fabricated Using an Improved Ru Precursor" IEEE, May 25-29, 2008.

Tamura et al., "High-Speed Electroabsorption Modulators Buried With Ruthenium-Doped SI-InP" IEEE Photonics Technology Letters, vol. 16, No. 12, Dec. 2004.

van Geelen et al., "Ruthenium Doped High Power 1.48 µm SIPBH Laser" 11th International Conference on Indium Phosphide and Related Materials Davos, Switzerland, May 16-20, 1999.

Söderström et al., "Electrical Characterization on Ruthenium-Doped InP Grown by Low Pressure Hydride Vapor Phase Epitaxy" Electrochemical and Solid-State Letters, vol. 4 Issue 6, 2001.

Dadgar et al., "Ruthenium—A Superior Compensator of InP" Applied Physics Letters 28, Dec. 1998.

Office Action issued in corresponding Japanese Patent Application No. 2012-552467, mailed Aug. 20, 2013, 12 pages.

* cited by examiner

OPTO-ELECTRONIC DEVICE

CROSS-REFERENCE TO RELATED APPLICATIONS

This application is a continuation of International Application No. PCT/GB2011/050221, filed on Feb. 9, 2011, which claims priority to Patent Application No. GB1002088.1 of Great Britain, filed on Feb. 9, 2010, both of which are hereby incorporated by reference in their entireties.

FIELD OF THE INVENTION

The present invention is in the field of electronic devices. In particular the invention concerns semiconductor electronic devices comprising current blocking structures such as (but not limited to) optoelectronic devices for optical communications.

BACKGROUND OF THE INVENTION

Opto-electronic devices such as lasers, optical amplifiers and modulators are commonly made using one or more p-n junctions that are formed when differently doped semiconductor materials are located against each other.

Dopants are materials typically introduced into semiconductor materials to bond within the semiconductor lattice. Once bonded into the semiconductor lattice, dopant atoms typically donate either an electron or a hole to the crystal lattice, depending on the type of dopant used. The donated electron or hole is free to move about the semiconductor lattice and becomes a conducting charge carrier. Semiconductor materials that have been doped to have an excess of electron charge carriers are called n-type semiconductors, whilst semiconductors that have been doped to have an excess of holes are called p-type semiconductors. These materials shall be termed 'n-type' and 'p-type' hereinafter throughout the application.

When an n-type and a p-type are located adjacent to each other, the resulting interface between the materials becomes a p-n junction. The basic p-n junction is the interface between two semiconductor materials wherein a depletion region exists about the junction with nominally no free (conduction) charge carriers because the holes at the junction material migrate away towards the p-type material whilst the electrons at the junction migrate away towards the n-type material. The resulting imbalance of charge carrier type either side of the p-n junction gives rise to a potential difference across the junction that is commonly exploited in many electronic and optoelectronic devices. This inherent potential difference is often exploited as a threshold value that a voltage applied across the junction must overcome in order for current to flow across the junction. When a drive voltage is applied to cause the electrons in the n-type and holes in the p-type to flow towards the p-n junction, this is known as 'forward bias'. When a drive voltage is applied to cause the electrons in the n-type and holes in the p-type to flow away from the p-n junction, this is known as 'reverse bias'.

When electrons and holes combine in a direct band gap semiconductor material, the electrons lose energy and turn from conduction electrons to valence electrons and in the process can emit light at a particular wavelength depending on the band gap between the valence and conduction bands in the semiconductor material. Conversely if light is incident upon the p-n junction with an energy (hence wavelength) that can be absorbed by the semiconductor material, electrons and holes are created in the p-n junction.

Optoelectronic devices such as semiconductor optical amplifiers and lasers exploit the p-n junction by applying forward bias to the junction causing the electrons and holes to meet in the depletion region and combine. The recombination at the p-n junction produces light that can be harnessed in a number of ways, for example: producing an incoherent light source when the opto-electronic device is an LED, a coherent light source if the opto-electronic device is a laser or for optical amplification when the opto-electronic device is a semiconductor optical amplifier (SOA).

Optoelectronic devices such as photodetectors and electro-absorption modulators exploit the p-n junction by applying reverse bias to the junction. When light is incident on the p-n junction of a photodetector and is absorbed by the semiconductor material, conduction holes and electrons are created that correspondingly get driven from the depletion region generating photocurrent. Electro-absorption modulators apply varying amounts of reverse bias to dynamically change the bandgap of the semiconductor, thus modulating the amount of light absorbed in the depletion region at a particular wavelength.

It is often desirable to make opto-electronic devices such as lasers, modulators and amplifiers that can be turned on or off at high speeds. This is important in optical communications where high bit rates are often required. One of the main properties of an opto-electonic device that limits the speed of operation is the capacitance across the p-n junction. The lower the capacitance, the higher the speed of the device.

Opto-electronic devices are typically formed using a variety of deposition and lithographic methods. Semiconductor devices commonly use the deposition method MOVPE (Metal Organic Vapour Phase Epitaxy)

When a semiconductor device is formed, it is known to use one or more different semiconductor materials. Typical semiconductor materials used for opto-electronic devices include indium phosphide (InP) and gallium arsenide (GaAs). If the p-type and n-type materials are differently doped versions of the same semiconductor material then the p-n junction is called a homo junction. If however semiconductor materials of the junction are different (apart from being doped differently) then the p-n junction is called a heterojunction. Heterojunctions can be alternatively formed by sandwiching one or more different undoped (intrinsic) semiconductor layers between n-type and p-type layers whereby the sandwiched layer or layers is known as an active layer or stack. The active layer/s or stack is a typically chosen for its optical properties and may be arranged to act as a single or a stack of quantum wells that act as optical waveguides confining the light.

It is also known to lithographically define the one or more p-n junctions as an upstanding 'mesa' and then surround the mesa using one or more 're-growth' steps with other materials, for example other semiconductors, so that the junction is 'buried' within the device. Burying the mesa results in a lower refractive index contrast to the side of the active waveguide than if air was disposed to the side of the active waveguide. This lower refractive index contrast makes the waveguide less prone to waveguide sidewall scattering loss. Furthermore, burying the active layer gives a larger top surface area to form an electrical contact on that helps reduce contact resistance. The surrounding layers are often semiconductor materials deposited using one of the above-mentioned deposition techniques. FIG. 1 shows a cross section of a laser of the prior art where semiconductor material is deposited around the sides of a buried heterojunction. In order to optimise the efficiency of an optoelectronic device such as a laser, it is desirable for current to be directed only through the active layer and not through the surrounding materials layers. When current flows through the surrounding layers adjacent to the active layer, this is known as 'leakage current'. Reverse biased current blocking junctions One method of the prior art that helps prevent 'leakage' current flowing through the surrounding semiconductor layers involves forming one or more 'current blocking' junctions (or structures) either side of the active device. The current blocking junction is typically a p-n junction formed using differently doped semiconductor layers and is designed to act as a reverse bias junction when the heterojunction with the active layer is in forward bias. A cross section of a laser device of the prior art with a current blocking junction is shown in FIG. 1 whereby the active layer 3 of the device is above n-type InP buffer layer 2 and substrate 1 and below the p-type InP layers 4 and 7 thus creating a heterojunction. Immediately to either side of the active layer is a p-type layer 5 below an n-type layer 6. Above layer 7 is a p type contact 8, a masking layer 9 and a metal contact 10. Because the orientation of p-n layers 5 and 6 are reversed in the vertical direction to layers 4 and 2, the current blocking junction is in a reverse bias configuration to the heterojunction. By having reversed biased 'current blocking' junctions either side of a forward biased junction with an active layer, electrons and holes are funneled into the active layer increasing the efficiency of the optoelectronic device.

One problem with conventional current blocking structures is that reverse biased p-n current blocking junctions suffer from a problem called thyristor action which at high drive currents and/or temperatures can result in the blocking structure breaking down and allowing a large current flow to pass through the current locking structure and away from the active layer/s, thus reducing the efficiency of the device.

It is has been recognised, (for example in "Analysis of current leakage in InGaAsP/InP buried heterostructure" Ohtoshi, T. et al. Journal of Quantum Electronics, Vol. 25, no. 6, pages 1369-1375), that to get low leakage current reverse biased junctions the thickness and doping levels of the blocking layers must be increased.

Despite these limitations, reverse biased p-n current blocking layers remain the standard method of limiting leakage current in devices that only require electrical modulation at moderate bit rates of up to approximately 1 Gbit/s.

Reverse biased p-n current blocking layers are also not ideally suited to higher bit rate modulation due to the large parasitic capacitance that the reverse biased junction causes within the device. Patent document EP1300917 (Ryder, et al) discloses an optoelectronic device incorporating a graded p-doped layer below the current blocking structure to reduce the device capacitance, however this structure is still subject to thyristor action at high temperatures and drive currents.

Semi-Insulating Layers

One approach to reduce device capacitance has been to replace the said reverse biased p-n junction blocking layers with one or more semiconductor layers that provide a higher resistivity than the surrounding semiconductor layers. Such high resistivity layers are often termed semi-insulating semiconductors and appear essentially undoped when measured using Capacitance Voltage (CV) profiling. Semi-insulating semiconductors provide current blocking without the large capacitance of a reverse biased current blocking junction.

Semiconductors may be doped using specific dopants that act to 'trap' conduction electrons and holes (otherwise known as electron or hole traps) for later release by thermal emission. The effect of these traps reduces the amount of conduction electrons flowing though the trapping region, thus making the 'trap-doped' semiconductor material semi-insulating.

Semi-insulating doped current blocking layers have previously been formed by replacing the layers 5 and 6 in FIG. 1 with iron (Fe) doped indium phosphide (InP) wherein the Fe dopant atoms act as electron traps. However, in semiconductor lasers and optical amplifiers where the device needs to operate under forward bias, Fe doped lasers are typically found to suffer from higher current leakage than conventional reverse biased p-n junction current blocking layers. One known cause of this excess leakage is the inter-diffusion of Fe with the commonly used p-type InP dopants such as Zinc (Zn).

Wasserbauer in conference paper TuB.4 from IPRM (Indium Phosphide and Related Materials Conference) in 1990 also showed that the resistivity of Fe doped InP is highly temperature dependant with the leakage current increasing by around 1 order of magnitude as the temperature was increased by every 25° C. above room temperature. This increased current leakage at higher device temperatures causes leakage problems when using Fe doped InP in uncooled semiconductor devices which need to operate at chip temperatures of up to 95° C.

Patent document WO 95/02910 discloses a number of semi-insulating dopants that act as hole traps such as Cr or Ti that can be used to form low capacitance current blocking layers when the hole trapping material is surrounded by p doped InP.

Ru—InP Layers

Ruthenium (Ru) doped semiconductors have previously been used as a low capacitance current blocking layer for both forward and reverse biased devices. Ru-doped InP has been shown in the prior art to be an effective hole trap but a poor electron trap. The interest in the material has resulted from the fact that Ru does not suffer from inter-diffusion problems with Zn or other commonly used p-type dopants.

U.S. Pat. No. 6,815,786 describes blocking layers grown around a mesa with an active layer. FIG. 2 show a diagrammatic representation of the device described in this patent document. A first thin layer of Fe doped InP 11 is grown adjacent to the mesa, followed by a thick layer 12 of Ru doped InP where said Ru doped layer is grown in a manner that makes it semi-insulating to enable a low device capacitance to be achieved.

U.S. Pat. No. 6,717,187 describes a structure similar to that described in U.S. Pat. No. 6,815,786 and shown in FIG. 2 but where the material used for layer 11 is the Ru—InP and layer 12 is Fe—InP, such that the Ru doped InP layer is adjacent to the mesa side wall, while the thicker Fe doped layer is located above the Ru layer. In the structure described in U.S. Pat. No. 6,717,187, the Ru layer is made to be semi-insulating so that current does not pass vertically through the Ru—InP layer and into the active region 3 that it contacts. The semi-insulating Ru—InP layer in this patent document is used to block the inter-diffusion of the Zn from mesa layer 7 and the Fe from layer 12.

Patent document DE19747996C1 discloses that in order to grow Ru in a form that is semi-insulating it is necessary to use processing conditions that can undesirably lead to the formation of growth defects referred to as hillocks. Hillocks cause growth morphology problems that reduce the yield of devices in a processing run. When grown as a semi-insulating current blocking layer only thin Ru-doped layers can be used if good morphology is to be maintained.

The Conference paper MoA2.4 by Lealman et al, shown at IPRM (Indium Phosphide and Related Materials Conference) May 2008 together with its corresponding presentation describes a current blocking structure with a single layer of Ru doped InP sandwiched in between single layers of (p-type) Zn InP as shown in FIG. 3. The 'p-Ru-p' current blocking structure was fabricated using atmospheric pressure MOVPE that focused on using Ru precursors of bis-isopropylcycopentadienyl ruthernium (IPCPRU) and bis-isobutyl-cycopentadienyl ruthenium (IBCPRu). The paper disclosed that the Ru—InP layer made using this method acted as a semiconductor layer with a low n-type doping and that the p-Ru-p structure showed capacitances higher than a normal standard p-n junction blocking structure. The 1st re-growth step around the mesa was composed of a thin 0.1 µm Zn doped InP layer 5, followed by a thick 0.8 µm layer of Ru doped InP 17 followed and capped with another thin 0.1 µm layer of Zn doped InP 18.

In contrast to U.S. Pat. No. 6,717,187 and U.S. Pat. No. 6,815,786 where the Ru—InP layers were grown to be semi-insulating and block the diffusion of Fe, conference paper MoA2.4 grew the Ru—InP as a low n-type layer so that it could form part of a reverse bias p-n junction current blocking structure wherein the Ru—InP still exhibited higher resistivity than conventional p-n junctions.

Because the Ru—InP layer was only low n-type doped, the Ru—InP blocking layer was grown to a large thickness of 0.8 µm in comparison to the thickness of the p-type layers in the blocking junction which were only grown to a thickness of 0.1 µm. When the Ru—InP layer in MoA2.4 was thinned to 0.6 µm thickness, a further 0.3 µm layer of semi-insulating Fe-doped InP was introduced below the Ru—InP. The problem with the increased thickness of the Ru—InP in the p-Ru-p structure was that the device showed higher capacitances than a normal standard p-n junction blocking structure and thus was not be suitable for operation at 1 OGbit/s modulation rates. Furthermore, thick layers of Ru—InP still suffer from morphology problems and are difficult to grow.

SUMMARY OF THE INVENTION

The present inventors have found that an n-doped Ru—InP layer in a current blocking junction can be made thinner than previously expected because n-type Ru—InP has been found to have an unexpectedly low carrier mobility for an n-type material.

The present inventors fabricated test samples (sample B) of Ru—InP by atmospheric pressure MOVPE using high vapour pressure precursors bis-isopropylcyclopentadienyl ruthenium (IPCPRu) or bisisobutylcyclopentadienyl ruthenium (IBCPRu). The Ru—InP layer was deposited on an Fe—InP doped substrate and over deposited with a cap of n-doped InGaAs. Another similar test sample (sample A) with similar deposition thicknesses was made but with a conventional n-doped InP layer (doped with sulphur) replacing the n-doped Ru—InP.

The absolute doping levels of the samples were measured using secondary mass spectroscopy (SIMS) while the level of electrically active dopant was measured using electrochemical profiling. The resistivity of the samples was measured by:

1. Evaporating titanium and gold on to the InGaAs cap layer of the samples.
2. Patterning and etching the metal and underlying InGaAs to leave a series of parallel pads with a plan area of approximately 150 µm by 500 µm with a range of different spacings from 10-350 µm. The space between the pads comprised the exposed surface of the Ru doped InP layer in sample B and S doped InP layer in sample A.
3. Re-patterning the samples around each set of pads and etching to remove all the surrounding grown InP down to the iron doped semi-insulating substrate.
4. Measuring the resistance between the metal pads.

With knowledge of the resistance and the electrically active doping level, the mobility, shown in table 1, was calculated. The Ru doped InP test sample B was unexpectedly found to have a mobility approximately 15 times lower than the equivalent standard n-type sulphur doped InP (sample A).

TABLE 1

| Sample | Layer | Measured thickness (nm) | Measured electrically active doping (cm$^{-3}$) | Measured resistivity (ohm. cm) | Mobility (crrf/V.scc) |
|---|---|---|---|---|---|
| Sample A | n+-InGaAs cap | 205 | $1.4 \times 10^{19}$ | | |
| | n-InP | 1030 | $3.5 \times 10^{16}$ | $9.75 \times 10^{-2}$ | $1.84 \times 10^3$ |
| | Fe—InP substrate | | | | |
| Sample B | n+-InGaAs cap | 205 | $1.6 \times 10^{19}$ | | |
| | Ru—InP | 1020 | $1.4 \times 10^{16}$ | 3.7 | $1.2 \times\!\times 10^2$ |
| | Fe—InP substrate | | | | |

The present inventors have realised that, unlike the prior art, layers of n-type Ru—InP in a current blocking junction can be made thinner than 0.6 µm or 0.8 µm but still be able to prevent excess leakage and thyristor action in conventional p-n current blocking layer configurations because the unexpectedly low mobility of the Ru—InP layer dramatically reduces the ability of electrons to travel through the blocking structure.

The present invention is as set out in the appended claims.

The present invention thus provides an electronic device comprising a current blocking structure; the current blocking structure comprising: a semiconductor material arrangement comprising an n-type ruthenium doped indium phosphide (Ru—InP) layer; and, a first p-type semiconductor material layer; the semiconductor material arrangement and p-type semiconductor material layer forming a first p-n junction; wherein the n-type ruthenium doped indium phosphide layer comprises a thickness less than 0.6 µm.

In a further aspect of the present invention there is provided an electronic device comprising a current blocking structure; the current blocking structure comprising: a first p-type semiconductor material layer; and, a semiconductor material arrangement comprising an n-type ruthenium doped indium phosphide (Ru—InP) layer; the semiconductor material arrangement and p-type semiconductor material layer forming a first p-n junction; wherein the semiconductor material arrangement is a layer stack comprising the n-type ruthenium doped indium phosphide layer and one or more further n-type InP materials.

In another aspect of the present invention there is provided an electronic device comprising a current blocking structure; the current blocking structure comprising: a first p-type semiconductor material layer; and, a semiconductor material arrangement comprising an n-type ruthenium doped indium phosphide (Ru—InP) layer; the semiconductor material arrangement and p-type semiconductor material layer forming a first p-n junction; wherein the current blocking structure further comprises an intrinsic semiconductor material.

DETAILED DESCRIPTION OF THE EMBODIMENTS

The present invention provides an electronic device comprising a p-n current blocking structure comprising n-type Ru doped InP. The Ru—InP is preferably made using atmospheric pressure MOVPE using novel high vapour pressure precursors such as bis isopropylcyclopentadienyl ruthenium (IPCPRu) and bisisobutylcyclopentadienyl ruthenium (IBCPRu) although in principle any technique to form n-type Ru-doped InP may be used. By using these precursors, high levels of Ru incorporation can be achieved but with a residual n-type background doping. By careful optimisation of the growth conditions including a growth temperature of 620° C. and III/V (Phosphide to Indium) ratio of 77 it is possible to grow layers that offer excellent morphology allowing thick layers of Ru doped InP to be grown with Ru concentration levels, measured using secondary ion mass spectroscopy, approaching 1e18 cm-3. In the following description, embodiments of the present invention will be described with references to the figures. The following embodiments serve as examples of how the present invention may be carried out and are not intended to limit the scope of the present invention.

First Embodiment

Figure 3:
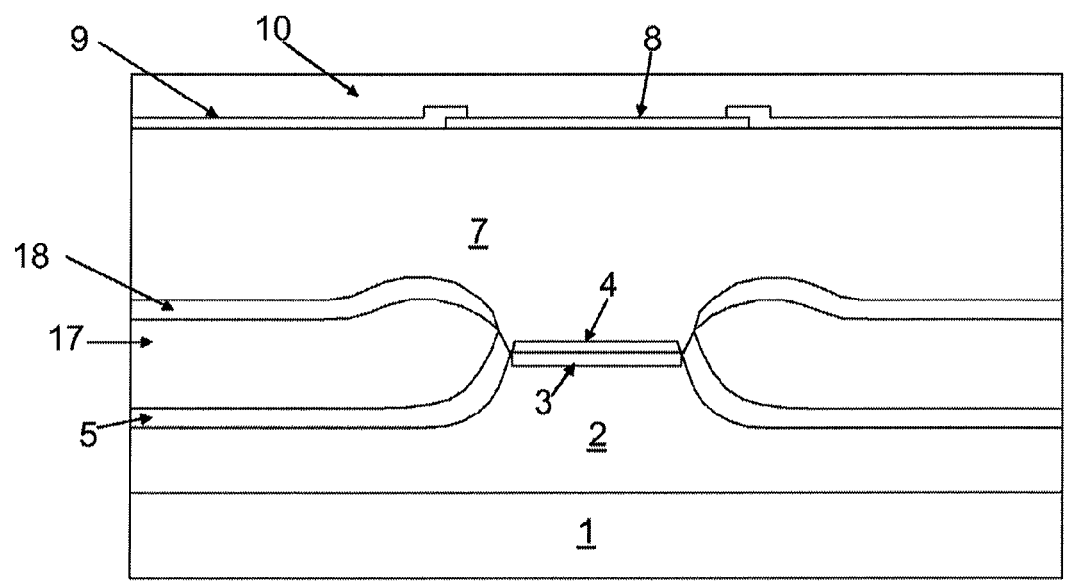
FIG. 3 shows a third electronic device of the prior art
Figure 4:
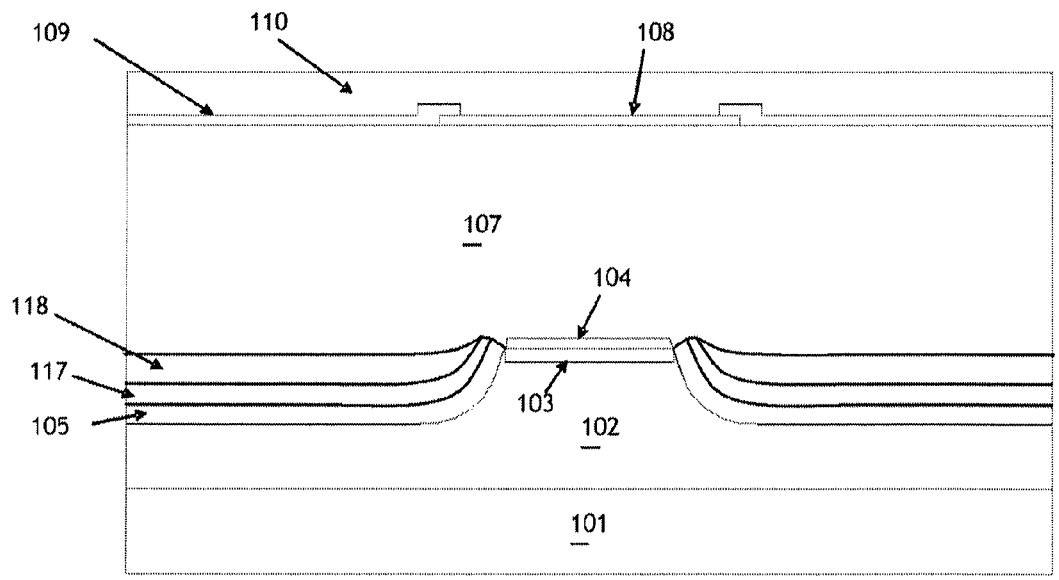
FIG. 4 shows an electronic device according to a first embodiment of the present invention.

The first embodiment of the present invention is an opto-electronic device with a similar cross section to the device structure shown in FIG. 3 and is shown in FIG. 4. Although this and other embodiments are opto-electronic devices, the device of the present invention may be any electronic device where a current blocking structure is required.

In this first embodiment the device is grown on a substrate. The substrate 101 is preferably comprised of n type semiconductor material such as InP typically doped with any of: S (sulphur), Si (silicon) or Sn (tin) to provide high n-carrier conductivity. Above substrate 101 is an n-type buffer layer 102 of InP is epitaxially grown. Layer 102 is also preferably doped with S, Si or Sn to provide high electron conductivity. An active region 103 of the device is grown above layer 102 and typically comprises one or more semiconductor material layers. The one or more semiconductor material layers are preferably composed of either InGaAsP, InGaAs, InAlGaAs or a multiplicity of layers composed of these material combinations that form a multiple quantum well active layer. This said active region 103 or active layer stack is generally undoped and in the finished device is surrounded by separate confinement heterostructure layers.

The active layer 103 is then covered/capped with a p-type semiconductor material layer 104 that forms a p-n heterojunction at least with layers 102 and 103. The p doped semiconductor layer 104 is preferably p doped InP where the preferred dopant is Zn. The top of layer 104 is then covered with a protective material layer that is then patterned using standard lithographic techniques to mask and define one or more mesa stripes. An etching process, is then used to etch completely through the layers 103 and 104 and preferably partially through layer 102 immediately surrounding the masked area to leave an upstanding mesa structure. This etch is preferably stopped at or within the InP buffer layer 102 such that the mesa height from the bottom etched level on top of or within layer 102 to the top of layer 104 is approximately 1.0 μm. However in principle the mesa height may be greater or less than 1.0 μm. The width of the mesa may vary depending on the device type and design of the active layer 103, but is typically between 1.0 μm to 3.0 μm.

The mesa structure is then buried with surrounding material using a growth technique such as Atmospheric pressure MOVPE under growth conditions that allow growth to occur on surfaces not covered by the masking layer above said mesa structure. In this embodiment, the mesa is buried on both sides by surrounding material, however in principle only one side of the mesa may be buried. Typically the surrounding material burying the mesa comprises one or more semiconductor materials, but may also include other materials such as metals and dielectrics, depending on the needs of the device design. This growth is called a re-growth.

In this re-growth, a current blocking structure is formed on both sides of the mesa, although in principle the structure can be on one side only. The first layer grown of the current blocking structure is a first p-type semiconductor material layer 105. Layer 105 is grown such that it is in intimate bordering contact with and provides a continuous layer over the etched surface of the wafer and mesa side wall. Layer 105 is typically composed of Zn doped InP, with a typical thickness of between 0.05 μm to 0.5 μm and a doping level between 5e17 cm-3 and 1e18 cm-3 but in principle may be any p-doped semiconductor material layer. Above this is grown a first n-type semiconductor material layer 117 comprising n-type Ruthenium doped InP which typically has a thickness of less than 0.8 μm, preferably 0.1 μm up to 0.8 μm, more preferably 0.1 μm up to 0.6 μm, more preferably 0.1 μm up to 0.4 μm. Other Ru—InP thicknesses thinner than 0.8 μm can also be used such as any of 0.2, 0.3, 0.5, 0.6 and 0.7 μm. Layer 117 preferably comprises an Ru doping level of 5e17-3 to 2e18 cm-3 and is also grown under conditions that are optimised to provide both good morphology and a background n doping level that varies typically between 1% and 10% of the Ru level. Typical growth conditions required to achieve this are a growth temperature of 620° C., a growth rate of 1.0 μm per hour and a V/III (Phosphorous to Indium) ratio of 77. Layers 105 and 117 form a current blocking p-n junction that in use acts as a reverse bias junction when the heterojunction with the active layer 103 is in forward bias.

After layers 105 and 117 have been deposited, a further optional layer of p-type semiconductor material 118 may be grown over layer 117. This optional layer preferably comprises Zn doped InP with a typically thickness between 0.05 μm to 0.1 μm and a doping level between 5e17 cm-3 and 1e18 cm-3 but in principle may be any p-doped semiconductor material layer. The mask layer covering the mesa is then removed and a second regrowth of p-type material is performed to cover the mesa and layers of the first re-growth. The second re-growth is preferably a doped InP cladding layer 107.

A highly doped p type contact 108 which is typically composed of InGaAs or InGaAsP is then deposited over the layer 107. The p-type contact layer 108 is preferably lithographically defined to a pattern superimposed at least partially over the mesa to direct current through the mesa and limit current spreading away from the mesa. The areas surrounding the patterned layer 108 are 'passivated' by depositing a masking layer 109 of non-conducting dielectric material such as silica or silicon nitride over the exposed top surface of layer 107 and at least partially over layer 108. A conducting contact layer 110, preferably comprised of one or more metals, is then deposited over layers 108 and 109 to provide an electrical contact. The metal for the contact layer 110 is preferably TiPtAu.

The total thickness of a current blocking layer structure is preferably equal to the height of the mesa +/−0.5 μm to provide a relatively flat morphology for the second re-growth to deposit upon. The present inventors have further found that because the n-type Ru—InP in the current blocking layer can be thinner than previously expected in the prior art but still give the required current blocking at high temperature to prevent thyristor breakdown, further layers may be used to provide further functionality without increasing the overall thickness of the structure surrounding the mesa to an undesirable extent.

The current blocking structure may, in principle, be formed on its own, separately from a mesa structure. The mesa may in principle comprise any p-n junction comprising an n-type semiconductor material layer and a p-type semiconductor material layer.

Second Embodiment

The second embodiment of the present invention is based upon the first embodiment of the present invention with additional features described as follows.

Because the n-type Ru—InP layer can prevent thyristor breakdown with a surprisingly small thickness e.g. down to 0.1 μm, one or more n-type semiconductor layers 116, 116a may be incorporated into the current blocking structure to thicken the p-n current blocking structure. Thickening the current blocking structure with one or more other n-type layers improves the current blocking of the device and is also advantageous because other n-type material layers may be easier to grow than Ru—InP and suffer less growth morphology problems. It is also conceivable in the second embodiment that the Ru—InP layer has a thickness greater than 0.6 μm or 0.8 μm.

Figure 5:
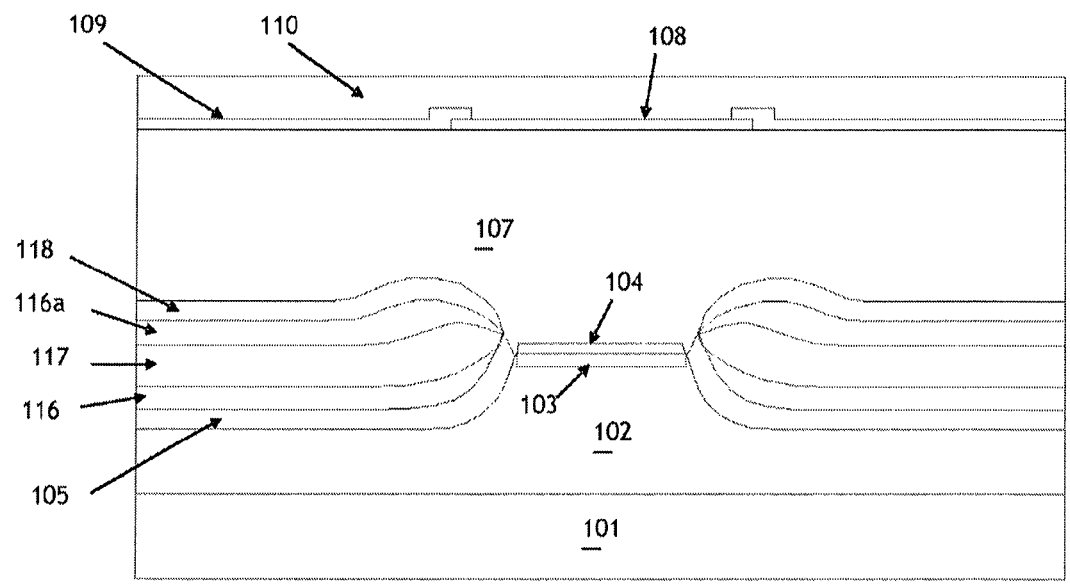
FIG. 5 shows an electronic device according to a second embodiment of the present invention.

FIG. 5 shows a cross section of a device according to the second embodiment of the present invention. The mesa fabrication processes are identical to those described in the first embodiment and so will not be described in detail. After the mesa is defined and etched, a first re-growth is again performed. In this regrowth the first layer 105 is grown such that it is in intimate bordering contact with and provides a continuous layer over the etched surface mesa side wall. Layer 105 in this embodiment preferably comprises Zn doped InP, with a typical thickness between 0.05 μm to 0.5 μm and a doping level between 5e17 cm-3 and 1e18 cm-3.

Above layer 105, a layer of n type semiconductor 116, preferably n-type InP is grown using a conventional dopant source material, such as but not limited to S. This layer is typically between 0.1 μm and 0.2 μm thick and is doped to a level between 1e18 cm-3 to 2e18 cm-3. Above layer 105 is grown a layer of Ru doped InP 117 as previously described in embodiment 1 which has a preferable thickness of approximately 0.1 μm to 0.4 μm and a preferable Ru doping level of 5e17-3 to 1e18 cm-3. This layer 117 is also preferably grown under conditions that are optimised to provide both good morphology and a background n doping level that varies between 1% and 10%. Typical growth conditions required to achieve this are a growth temperature of 620° C., a growth rate of 1.0 μm per hour and a V/III (Phosphorous to Indium) ratio of 77. Above layer 117 is optionally grown a second layer of n type semiconductor material 116a such as n-doped InP. Layers 116 and 116a in the embodiment shown in FIG. 5 border and sandwich layer 117.

Layer 116a is typically grown using a conventional dopant source, such as but not limited to S. This layer 116a comprises a thickness typically between 0.1 μm and 0.2 μm and preferably comprises a doping to a level between 1e18 cm-3 to 2e18 cm-3. Finally, an optional thin layer of p-type semiconductor material 118 is grown over layer 117 or 116a to complete the first re-growth. This layer 118 preferably comprises Zn doped InP and has a typically thickness between 0.05 μm to 0.1 μm and have a preferred doping level between 5e17 cm-3 and 1e18 cm-3. The mask layer is then removed and layers 107, 108, 109 and 110 are formed as described in the first embodiment.

A variation of the second embodiment would be to reduce the thickness of layers 116 and 117 and to repeat the growth of these layers prior to the growth of layer 116a to form a plurality 120 of low and high mobility n type layers. Preferably the layers 116 and 117 are alternately arranged adjacently to one another in a sandwiching arrangement. The layer 116a could be removed from the structure without a significant impact on the current blocking performance.

Figure 1:
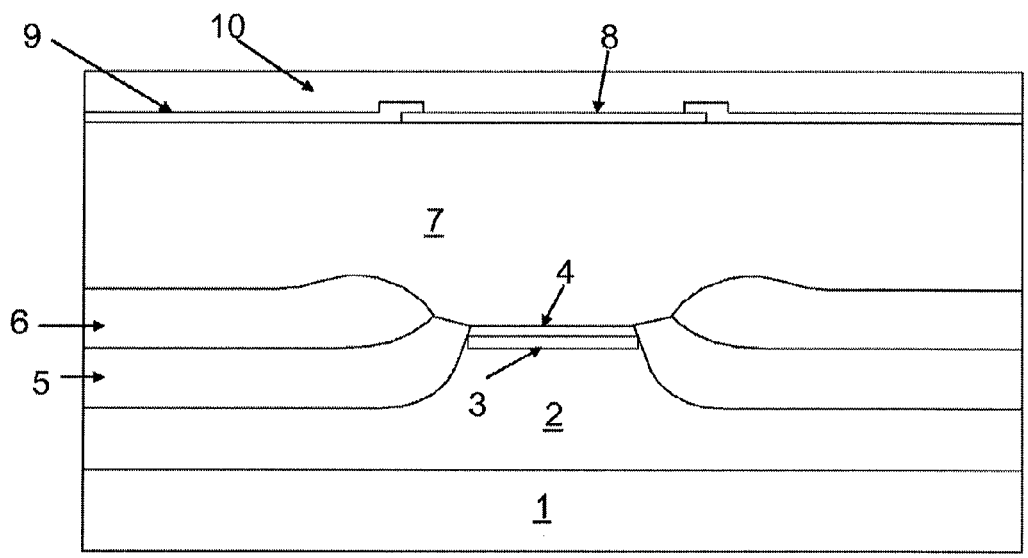
FIG. 1 shows a first electronic device of the prior art
Figure 2:
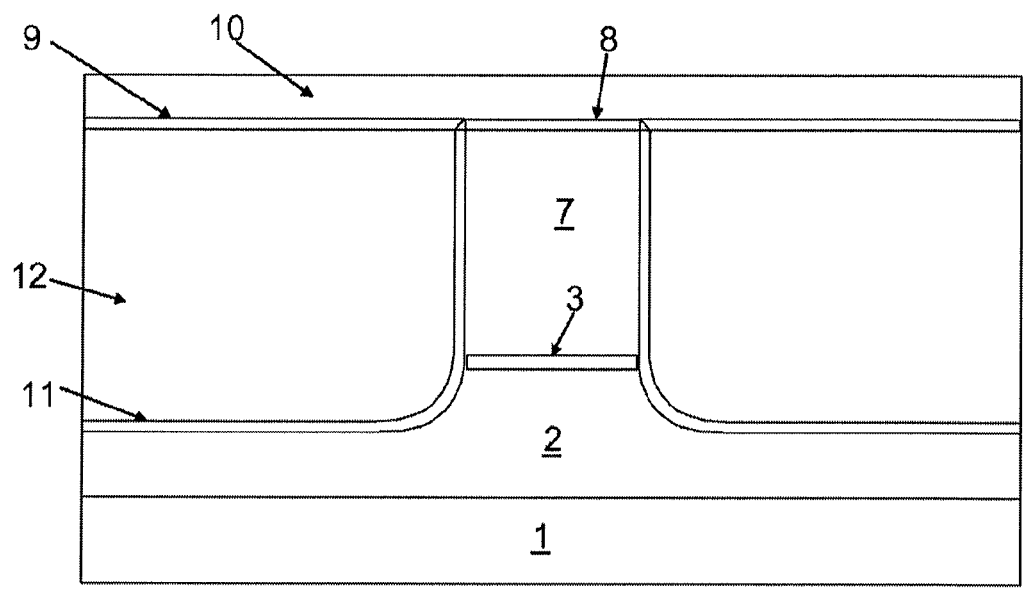
FIG. 2 shows a second electronic device of the prior art
Figure 8:
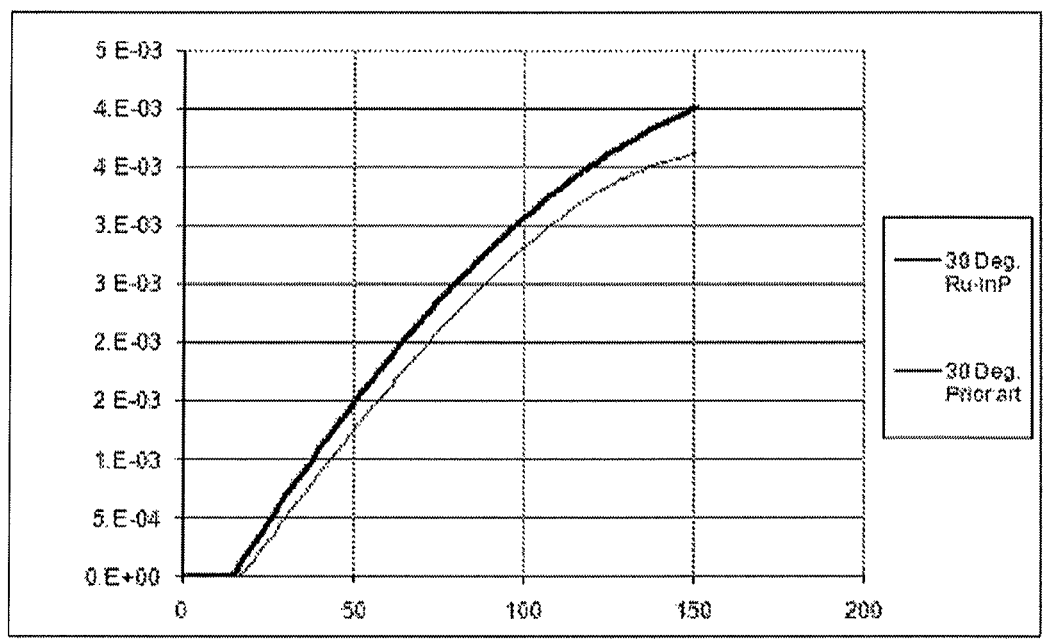
FIGS. 8-10 show graphs of measured results for the second embodiment of the present invention at various operating temperatures, compared to a prior art device.
Figure 9:
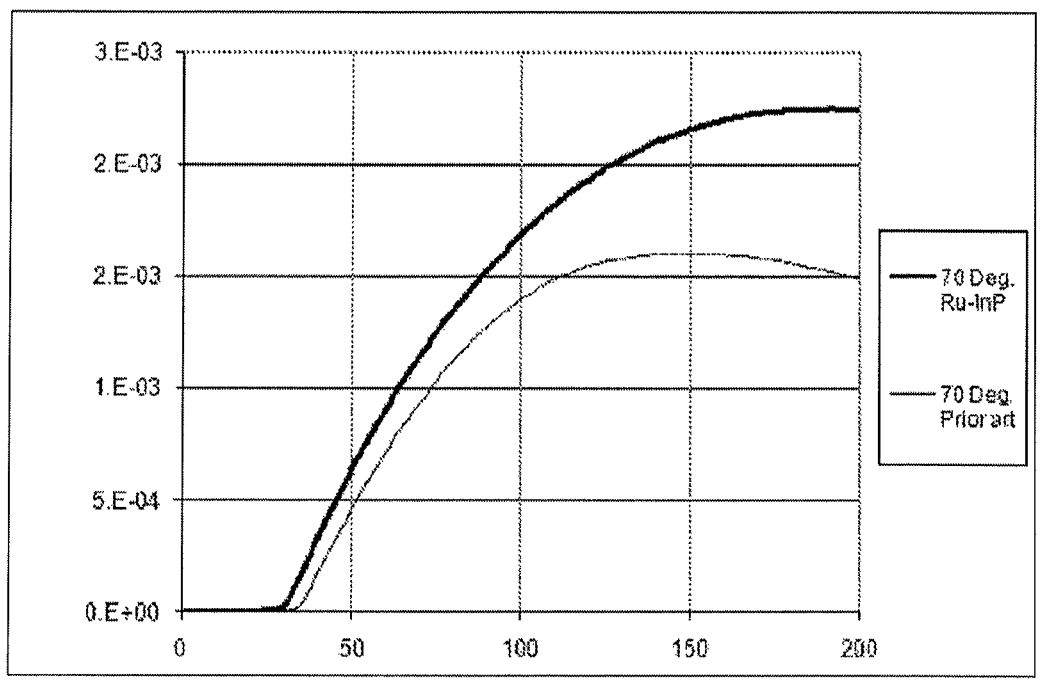
Figure 10:
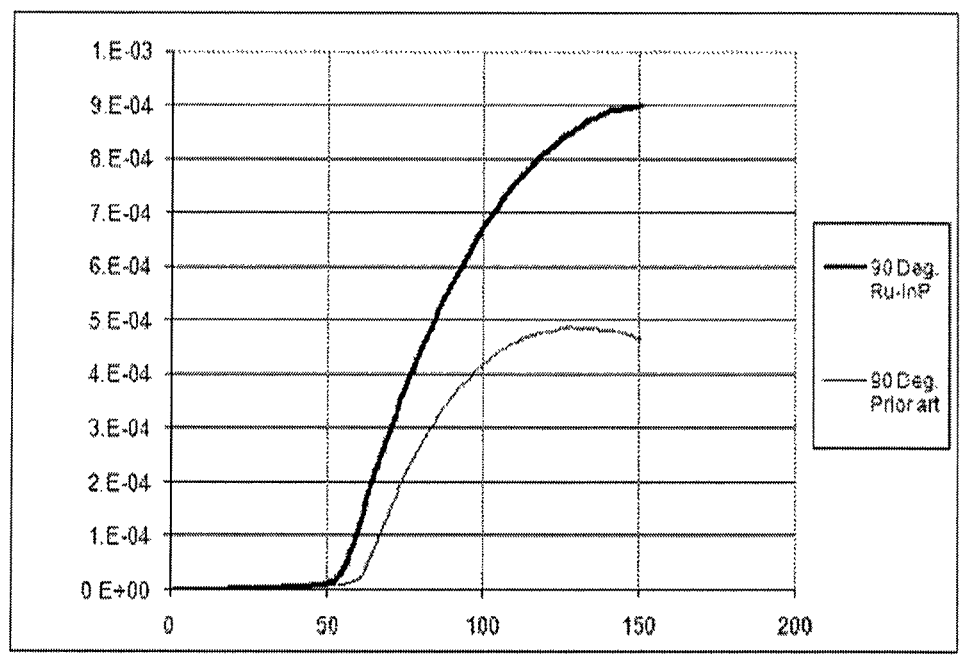

Laser devices according to the second embodiment of the present invention were fabricated with a 0.1 μm layer 117 of n-type Ru-doped InP, a layer 116 of 0.15 μm thick n-type S-doped InP and a layer 116a of 0.15 μm thick n-type S-doped InP, and a 0.5 μm thick layer 105 of Zn doped InP. Layer 118 was omitted. The devices were then measured by maintaining the temperature of the device at a constant value and increasing the injection current. The output light was measured for each current level using a power meter. FIGS. 8, 9 and 10 show the graphs of the results for device temperatures of 30, 70 and 90 degrees C. respectively. The x-axis in each of the graphs is the injection current in mA whilst the y axis for each of the graphs is the output light power in relative units from the power meter. Devices of the prior art were also made, similar to the device shown in FIG. 1, whereby layers 116, 117 and 116a of FIG. 5 were replaced by a single 0.4 μm thick layer of n-type S-doped InP and layer 118 was omitted. These 'prior art' devices were also measured as described above.

The thicker result lines on the graphs in FIGS. 8-10 are the results for the second embodiment (labelled in the key as Ru—InP) whereas the thinner result lines on the graphs are those of the 'prior art' device. In all of the graphs in FIGS. 8-10 the lasing threshold current for the 'Ru—InP' device is lower than the 'prior art' device at all of the measured temperatures. The lower threshold current shows that the incorporation of a thin 0.1 μm layer of n-type Ru-doped InP in the 'Ru—InP' device provided enhanced leakage current blocking than the prior art device, even at low operating temperatures such as 30 degrees.

The particularly improved performance of the Ru—InP device at high temperatures is shown in FIGS. 9 and 10. The Ru—InP device shows markedly higher values of optical output power for a given injection current compared to the prior art device, although some improvement is apparent even at 30 degrees C. (see FIG. 8), as mentioned above. In FIG. 10, the output power of the Ru—InP device at a current of 150 mA approaches approximately twice that of the prior art device. In FIGS. 8-10, the Ru—InP device also does not decrease output power with increasing current which shows that further indicating at the high temperatures of 70 and 90 degrees C. the reduced leakage current of the Ru doped device.

Third Embodiment

Figure 6:
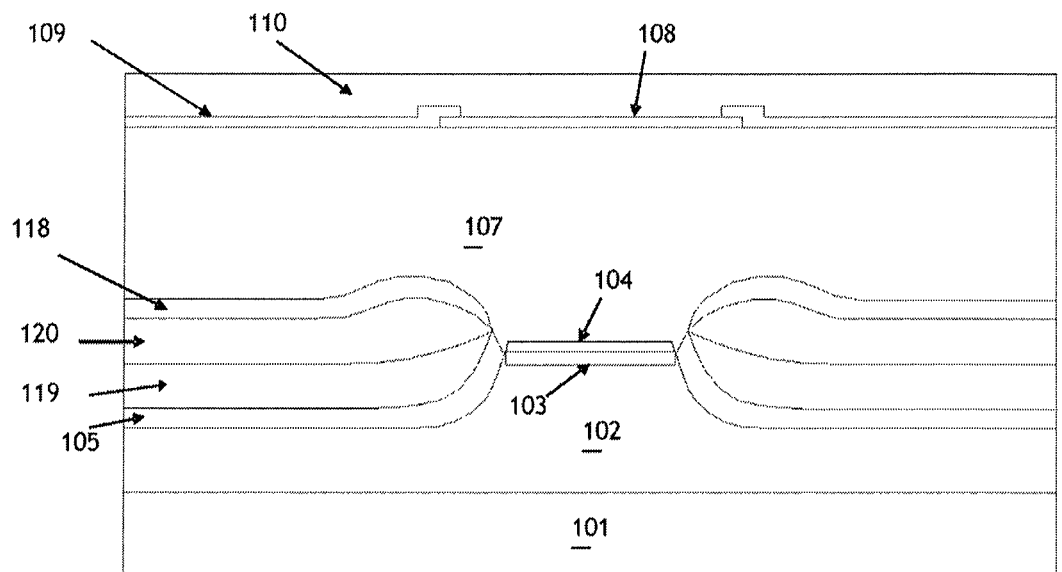
FIG. 6 shows an electronic device according to a third embodiment of the present invention.

The third embodiment of the present invention is based upon the first and second embodiments of the present invention with additional features described as follows. FIG. 6 shows a cross section of the device structure according to the third embodiment of the present invention. This embodiment is similar to the first and second embodiments and further includes a layer 119 of undoped intrinsic semiconductor material to reduce the capacitance of the device when forward biased. The third embodiment of the present invention therefore provides a device that in use can be direct modulated at data rates such as 1 OGbit/s. The function of the intrinsic layer 119 is to physically separate an n layer arrangement 120 and p layer/s 105 within the current blocking structure thereby increasing the width of the current blocking p-n junction of the current blocking structure.

The mesa fabrication processes are identical to those described in the first embodiment and so will not be described in detail. Above layer 105 is grown a layer 119 of undoped or intrinsic semiconductor such as InP with a preferable thickness between 0.1 µm and 0.5 µm. In principle, one or more layers of intrinsic/undoped material may be grown. Above layer 119 is grown a arrangement 120 comprising one or more layers of n-type semiconductor material wherein at least one of the n-type layers is Ru—InP as previously described in the first and second embodiments. This arrangement 120 can be termed the 'low mobility arrangement' and preferably comprises either a single layer of low mobility n doped Ru InP or, as described in the second embodiment, a plurality of layers at least one of which is a thin low mobility n doped Ru InP layer and at least one of which is a thin high mobility n doped InP layer grown using a conventional dopant such as but not limited to S. The overall thickness of the arrangement 120 is typically in the range of 0.1 µm to 0.8 µm. However it is also conceivable in the third embodiment that the Ru—InP layer/s may comprise a thickness greater than 0.6 µm or 0.8 µm. Similarly to the first two embodiments, an optional thin layer of p-doped semiconductor material 118, preferably Zn doped InP may be grown over the top of layer 120 to complete the re-growth.

The three embodiments previously described are suited to the fabrication of low impedance forward biased devices such as semiconductor lasers or semiconductor optical amplifiers (SOA). However, the use of a p doped InP layer 105 in FIGS. 4-6 adjacent to and contacting the mesa sidewall causes high capacitance in high impedance reverse biased devices such as electro-absorption modulators (EAM) or waveguide photodiodes (PD). The position of the layer 105 in relation to the active layer/s 103 also limits the usefulness of the above three embodiments in monolithically integrated devices that incorporate both a forward biased device and a reverse biased device because the current blocking structure will only work for the forward biased device. Monolithically integrated devices may comprise a (forward biased) laser or an SOA and a reverse biased device such as an EAM or PD in a monolithically integrated photonic device. An example of such a monolithic device is an integrated laser modulator.

Fourth Embodiment

The fourth embodiment of the present invention is based upon the first, second and third embodiments of the present invention with additional features described as follows.

Figure 7:
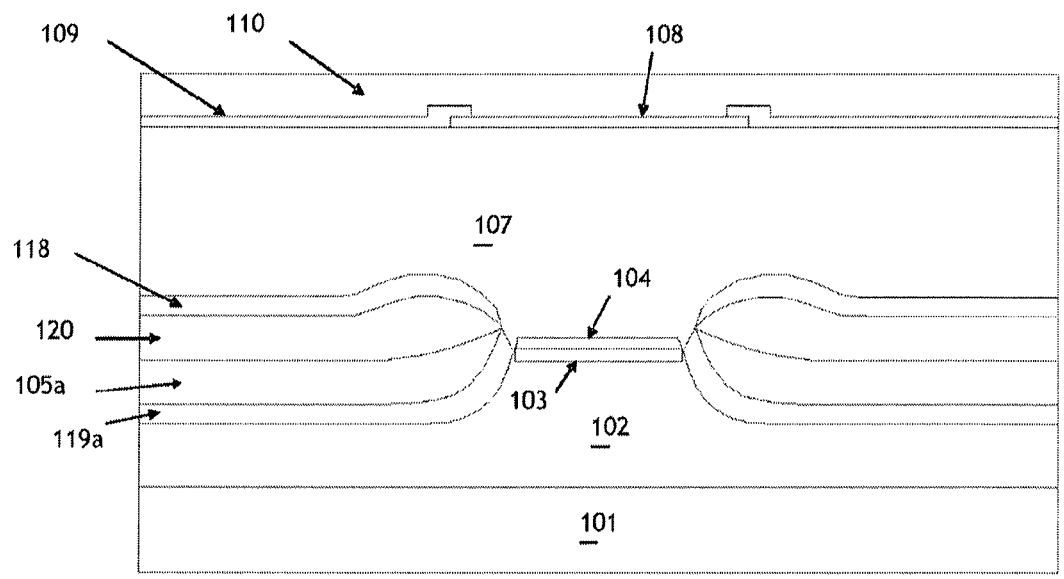
FIG. 7 shows an electronic device according to a fourth embodiment of the present invention.

FIG. 7 shows a cross section of a device according to the fourth embodiment of the present invention that comprises a current blocking structure suitable for use in both forward and reverse biased devices as well as integrated devices that include both forward and reverse biased device structures within one chip.

Again, the wafer growth and mesa formation process are as described in the previous embodiments for single bias devices such as discrete semiconductor lasers, SOAs, EAMs or PDs. For monolithic chips, additional steps may need to be incorporated to optimise device structure for both the forward and reverse biased parts of the device. Such modifications include but are not limited to quantum well intermixing or butt coupled regrowths.

In this embodiment the first layer 119a grown in the first re-growth is a layer of undoped or intrinsic semiconductor such as InP. Layer 119a is in intimate contact with and provides a continuous layer over the etched surface of the wafer and mesa side wall. The thickness of layer 119a is typically between 0.1 µm and 0.5 µm. Above layer 119a is grown a layer 105a of a p-type semiconductor material such as Zn doped InP. Layer 105a comprises a typical thickness between 0.05 µm to 0.5 µm and a preferred doping level between 5e17 cm-3 and 1e18 cm-3 although in principle it can be any suitable thickness and doping level. Above layer 105a this is grown a low mobility arrangement 120 or a single layer of the n-type Ru-doped InP as described in the second and third embodiments. It is conceivable in the fourth embodiment that the Ru—InP layer/s may comprise a thickness greater than 0.6 µm or 0.8 µm.

The layers in all the above embodiments may be formed using other techniques and processes commonly available to a skilled person in the art. Furthermore, the described order and procedures in and by which the layers are formed in the present application only serve as preferred examples of forming the device with current blocking structure of the present invention, which in principle may be formed in and by other processes and sequences. The p-doped semiconductor layers 105, 105a, 118 may comprise one or more similar or different layers of p-doped material.

What is claimed is:

1. An electronic device comprising a current blocking structure; the current blocking structure comprising:
   a) a first p-type semiconductor material layer; and,
   b) a semiconductor material arrangement comprising an n-type ruthenium doped indium phosphide (Ru—InP) layer;
      the semiconductor material arrangement and p-type semiconductor material layer forming a first p-n junction, wherein the n-typed Ru—InP layer is directly disposed over the first p-type semiconductor material layer;
      wherein the n-type ruthenium doped indium phosphide layer comprises a thickness less than about 0.6 µm.

2. The device as claimed in claim 1 wherein the semiconductor material arrangement is a layer stack comprising the n-type ruthenium doped indium phosphide layer and one or more further n-type InP materials.

3. The device as claimed in claim 1 wherein the current blocking structure further comprises an intrinsic semiconductor material.

4. The device as claimed in claim 1 further comprising a second p-n junction disposed to a side of the first p-n junction: the second p-n junction comprising an n-type semiconductor material layer and a p-type semiconductor material layer.

5. The device as claimed in claim 4 wherein the n-type ruthenium doped indium phosphide layer and first p-type semiconductor material layer are positioned in a substantially opposite orientation to the n and p-type semiconductor material layers of the second p-n junction.

6. The device as claimed in claim 5 wherein the second p-n junction is bordered by the intrinsic semiconductor material.

7. An electronic device comprising a current blocking structure; the current blocking structure comprising:
   a) a first p-type semiconductor material layer;
   b) a semiconductor material arrangement comprising an n-type ruthenium doped indium phosphide (Ru—InP) layer;
   the semiconductor material arrangement and p-type semiconductor material layer forming a first p-n junction;
   wherein the semiconductor material arrangement is a layer stack comprising the n-type ruthenium doped indium phosphide layer and one or more further n-type InP materials;
   and a second p-n junction disposed to a side of the first p-n junction: the second p-n junction comprising an n-type semiconductor material layer and a p-type semiconductor material layer.

8. The device as claimed in claim 7 wherein the n-type ruthenium doped indium phosphide layer and first p-type semiconductor material layer are positioned in a substantially opposite orientation to the n and p-type semiconductor material layers of the second p-n junction.

9. An electronic device comprising a current blocking structure; the current blocking structure comprising:
   a) a first p-type semiconductor material layer;
   b) a semiconductor material arrangement comprising an n-type ruthenium doped indium phosphide (Ru—InP) layer;
   the semiconductor material arrangement and p-type semiconductor material layer forming a first p-n junction;
   wherein the current blocking structure further comprises an intrinsic semiconductor material; and
   a second p-n junction disposed to a side of the first p-n junction: the second p-n junction comprising an n-type semiconductor material layer and a p-type semiconductor material layer.

10. The device as claimed in claim 9 wherein the semiconductor material arrangement is a layer stack comprising the n-type ruthenium doped indium phosphide layer and one or more further n-type InP materials.

11. The device as claimed in claim 9 wherein the n-type ruthenium doped indium phosphide layer and first p-type semiconductor material layer are positioned in a substantially opposite orientation to the n and p-type semiconductor material layers of the second p-n junction.

12. The device as claimed in claim 11 wherein the second p-n junction is bordered by the intrinsic semiconductor material.

13. The device as claimed in claim 9 wherein the ruthenium doped indium phosphide layer comprises a thickness between about 0.1 µm and about 0.4 µm.

14. The device as claimed in claim 9 wherein the current blocking structure comprises a second p-type semiconductor material.

* * * * *